(12) United States Patent
Lee et al.

(10) Patent No.: US 10,243,579 B2
(45) Date of Patent: Mar. 26, 2019

(54) PROGRAMMABLE TRIM FILTER FOR SUCCESSIVE APPROXIMATION REGISTER ANALOG TO DIGITAL CONVERTER COMPARATOR

(71) Applicant: Avnera Corporation, Beaverton, OR (US)

(72) Inventors: Wai Lee, Portland, OR (US); Garry N. Link, Pacific City, OR (US)

(73) Assignee: AVNERA CORPORATION, Beaverton, OR (US)

( * ) Notice: Subject to any disclaimer, the term of this patent is extended or adjusted under 35 U.S.C. 154(b) by 0 days.

(21) Appl. No.: 15/832,503

(22) Filed: Dec. 5, 2017

(65) Prior Publication Data
US 2018/0183454 A1   Jun. 28, 2018

Related U.S. Application Data

(60) Provisional application No. 62/438,912, filed on Dec. 23, 2016.

(51) Int. Cl.
| | |
|---|---|
| *H03M 1/00* | (2006.01) |
| *H03M 1/46* | (2006.01) |
| *H03M 1/06* | (2006.01) |
| *H03M 1/80* | (2006.01) |
| *H03M 1/16* | (2006.01) |
| *H03M 1/14* | (2006.01) |
| *H03M 1/12* | (2006.01) |
| *H03M 1/18* | (2006.01) |

(52) U.S. Cl.
CPC ......... *H03M 1/462* (2013.01); *H03M 1/0626* (2013.01); *H03M 1/0695* (2013.01); *H03M 1/124* (2013.01); *H03M 1/145* (2013.01); *H03M 1/164* (2013.01); *H03M 1/468* (2013.01); *H03M 1/806* (2013.01); *H03M 1/181* (2013.01)

(58) Field of Classification Search
CPC ...... H03M 1/468; H03M 1/12; H03M 1/1225; H03M 1/1245; H03M 1/0626; H03M 1/0872; H03M 1/164; H03M 1/183; H03M 1/44; H03M 1/466; H03M 1/68; H03M 1/06; H03M 1/0836; H03M 3/454
USPC .................................. 341/118, 120, 155, 172
See application file for complete search history.

(56) References Cited

U.S. PATENT DOCUMENTS

| | | | | |
|---|---|---|---|---|
| 6,307,497 | B1 * | 10/2001 | Leung ................... | H03M 1/129 341/139 |
| 8,350,738 | B2 * | 1/2013 | Sanduleanu ........... | G11C 27/02 327/96 |

(Continued)

*Primary Examiner* — Linh Nguyen
(74) *Attorney, Agent, or Firm* — Miller Nash Graham & Dunn LLP

(57) ABSTRACT

The disclosure includes a successive approximation register (SAR) analog to digital converter (ADC). The SAR ADC includes a sampling network to store a sample of an analog signal. The SAR ADC also includes a comparator to successively compare the sample to reference values to determine a digital value corresponding to the sample of the analog signal. The comparator employs a plurality of comparator preamplifiers. The comparator also includes a programmable trim filter. The programmable trim filter is selectively set to adjust a bandwidth of the comparator preamplifiers to a bandwidth value corresponding with a preamplifier settling time subceeding a preamplifier settling threshold.

18 Claims, 10 Drawing Sheets

(56) References Cited

U.S. PATENT DOCUMENTS

| | | | |
|---|---|---|---|
| 2003/0123646 A1* | 7/2003 | Srinivasan | H03M 1/0697 379/399.01 |
| 2005/0190089 A1* | 9/2005 | Draxelmayr | H03M 1/0624 341/141 |
| 2011/0304490 A1* | 12/2011 | Janakiraman | H03K 5/2481 341/122 |
| 2012/0306676 A1* | 12/2012 | Balasubramaniam | H03M 1/0678 341/144 |
| 2013/0021018 A1* | 1/2013 | Venkataraman | H03M 1/1295 324/123 R |
| 2013/0057424 A1* | 3/2013 | Jeon | H03M 1/462 341/156 |
| 2016/0134300 A1* | 5/2016 | Wang | H03M 1/0854 341/172 |

\* cited by examiner

PROGRAMMABLE TRIM FILTER FOR SUCCESSIVE APPROXIMATION REGISTER ANALOG TO DIGITAL CONVERTER COMPARATOR

CROSS-REFERENCES TO RELATED APPLICATIONS

The present application claims benefit from U.S. Provisional Patent Application Ser. No. 62/438,912, filed Dec. 23, 2016, and entitled "Programmable Trim Of SAR Comparator," which is incorporated herein by reference as if reproduced in its entirety.

BACKGROUND

Analog to Digital Converters (ADCs) are employed in many technological areas. For example, an ADC may be employed to convert captured analog audio data into a digital format for further processing. Such circuits may be developed using a variety of technologies. For example, an ADC may be implemented in Complementary Metal-Oxide-Semiconductor (CMOS). Variations inherent in the CMOS fabrication process may result microchips of varying speeds. For example, a specified batch of microchips sharing the same design may include average speed chips, fast chips, and slow chips. When designing high performance audio ADCs, such variations between microchips may results in significant design constraints. For example, designs that ensure the slow chips are operate within expected parameters may result in excess power usage and/or noise in the average speed and fast chips.

BRIEF DESCRIPTION OF THE DRAWINGS

Aspects, features and advantages of embodiments of the present disclosure will become apparent from the following description of embodiments in reference to the appended drawings in which.

DETAILED DESCRIPTION

Figure 1:
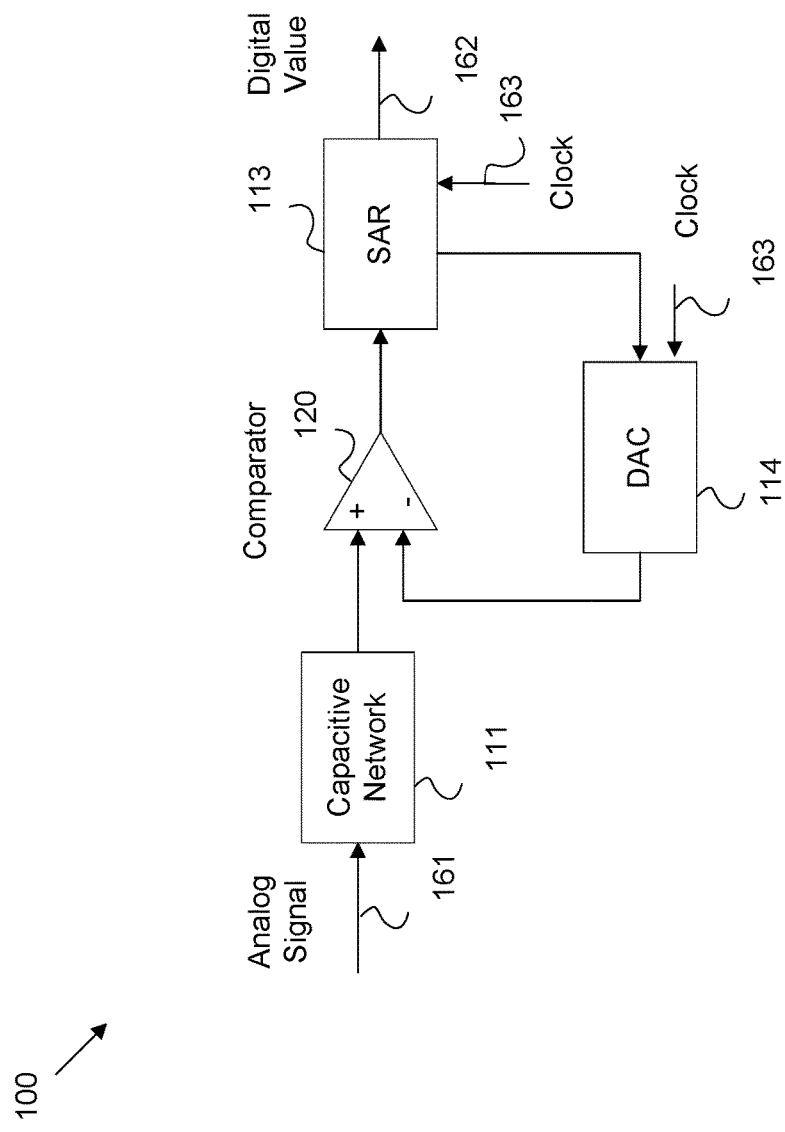
FIG. 1 is a schematic diagram of an example Successive Approximation Register (SAR) Analog to Digital Converter (ADC) architecture.

A Successive Approximation Register (SAR) process may be employed to convert an analog signal into a digital signal. In a SAR process, a sample of the analog signal is successively compared to reference values to determine a corresponding digital value. This process involves a sampling phase where the sample is taken and a SAR phase where the digital value is approximated by the SAR network. The SAR process may involve significant changes in voltage/charge levels in the SAR components between successive phases and sub-phases. Hence, the components may require time to charge and/or discharge to move from a first charge level to a second charge level. The time taken for a component to move from a first charge state to a steady second charge state may be referred to as a settling time. For example, a comparator employed to compare the sample to the reference value may include an array of preamplifiers. When a sample value changes from a high value to a low value (or vice versa), the preamplifier may require a certain amount of time to settle to the new value. As noted above, CMOS manufacturing processes may result in average speed chips, fast chips, and slow chips in the same batch. This can cause problems because a slow chip with slow settling time may not reach a steady state before a next comparison is made. This may result in erroneous data for the slow chips. Providing additional power may increase the bandwidth of the chips and reduce settling time. However, increasing bandwidth also increases noise. Hence, provide additional power to address the settling time of the slow chips may result in unnecessarily increasing noise in the fast chips. Further, increasing power to address settling time may also unnecessarily increase power usage by the fast chips, which is undesirable in low power applications such as audio peripheral devices (e.g. headphones).

Disclosed herein is a SAR ADC with a programmable trim filter that supports optimizing each microchip for bandwidth, settling, and noise. The programmable trim filter includes a network of capacitors in the analog domain controlled by a processor via transistors. The programmable trim filter may be positioned in a comparator between an array of comparator preamplifiers and a latch. The programmable trim filter can be adjusted to decrease or increase filter capacitance, and hence increase/decrease bandwidth, decrease/increase settling time, and increase/decrease noise based on the speed of the microchip, respectively. A setting for the programmable trim filter for a specified microchip can be determined after manufacture (e.g. on a first startup). The SAR ADC may include a process monitor. The process monitor includes a ring oscillator of preamplifiers that mirrors the preamplifiers in the comparator. The process monitor may also include a test filter, which may be similar to the programmable trim filter. The frequency response of the ring oscillator (and hence speed of the microchip) may be tested by the processor via the process monitor. By determining the frequency response of the ring oscillator, the processor can select a setting for the programmable trim filter and store the setting in non-volatile memory (e.g. in firmware). Upon subsequent operating, the processor can employ the programmable trim filter to operate the SAR ADC and provide bandwidth tailored to the specific microchip. Hence, fast microchips can operate on lower bandwidth with less noise, while slower chips can operate on more bandwidth without causing settling related errors. The process monitor may also include a frequency division circuit to reduce a frequency of the process monitor output to support measurement of the frequency response of the ring oscillator by the processor.

FIG. 1 is a schematic diagram of an example SAR ADC 100 architecture. The SAR ADC 100 includes a capacitive network 111, a comparator 120, a SAR 113, and a Digital to Analog Converter (DAC) 114 coupled as illustrated. The capacitive network 111 is coupled to an incoming analog signal 161. The capacitive network 111 includes a plurality of capacitors of varying levels of capacitance. The capacitors store charge from the analog signal 161 as a sample of the analog signal 161 at a discrete instant in time. The SAR 113 may include a register for storing digital data as well as a circuit for providing known reference values. The DAC 114 is any device capable of converting a digital value to a corresponding analog signal value. The SAR 113 is configured to forward a known reference value (e.g. a one or a negative one) via the DAC 114 to the comparator 120 for each bit of the sample. The comparator 120 is any electronic device capable of comparing two voltages and outputting an indication of which voltage is larger. The comparator 120 receives both the voltage from the sample in the capacitive network 111 and the known reference value from the SAR 113 via the DAC 114. The comparator 120 then indicates which value is larger. The result of the comparison is stored in the SAR 113 as a bit of a corresponding digital value 162.

As such, the capacitive network 111 may include a capacitor/capacitor group for storing a portion of the analog signal for each bit desired in the digital value 162. The SAR ADC 100 may then iteratively test the electrical charge from each group of capacitors in the capacitive network 111 against the known value from the SAR 113 on a bit by bit basis. The results are stored in the SAR 113. Once all the desired bits have been tested, the resulting digital value 162 may be forwarded from the SAR ADC 100 for further use by coupled systems. While an SAR ADC 100 may be implemented in many different fashions, it should be noted that the capacitive network 111 and the DAC 114 may be implemented in a common capacitor network.

To operate properly, the comparator 120 repeatedly latches after comparison of various values from the capacitive network 111 and the DAC 114. Such values may swing substantially, for example between a first sample from the capacitive network 111 and a second sample from the capacitive network 111. To perform such function, the comparator's 120 internal amplifiers should be provided with sufficient time to charge/discharge from the first sample bit to settle at a charge for the second sample bit. If the comparator's 120 amplifiers do not have enough time to settle, then erroneous outputs may result. When implemented in CMOS, different microchips may require different settling times. Hence, the comparator 120 may be configured with a programmable trim filter as discussed below. The programmable trim filter may allow the capacitance, and hence the bandwidth, provided to the comparator 120 to be adjusted. By adjusting the programmable trim filter of the comparator 120, the settling time is reduced to an amount sufficient to mitigate errors, while not overly increasing bandwidth, which would result in unnecessarily increasing signal noise. It should also be noted that the SAR 113 and the DAC 114 operate based on a clock signal 163. For example, the comparator 120 may be implemented in a single SAR processor with the SAR 113 and the DAC 114. The SAR processor may then cause the comparator 120 to latch on a rising edge and/or a falling edge of the clock signal 163.

Figure 2:
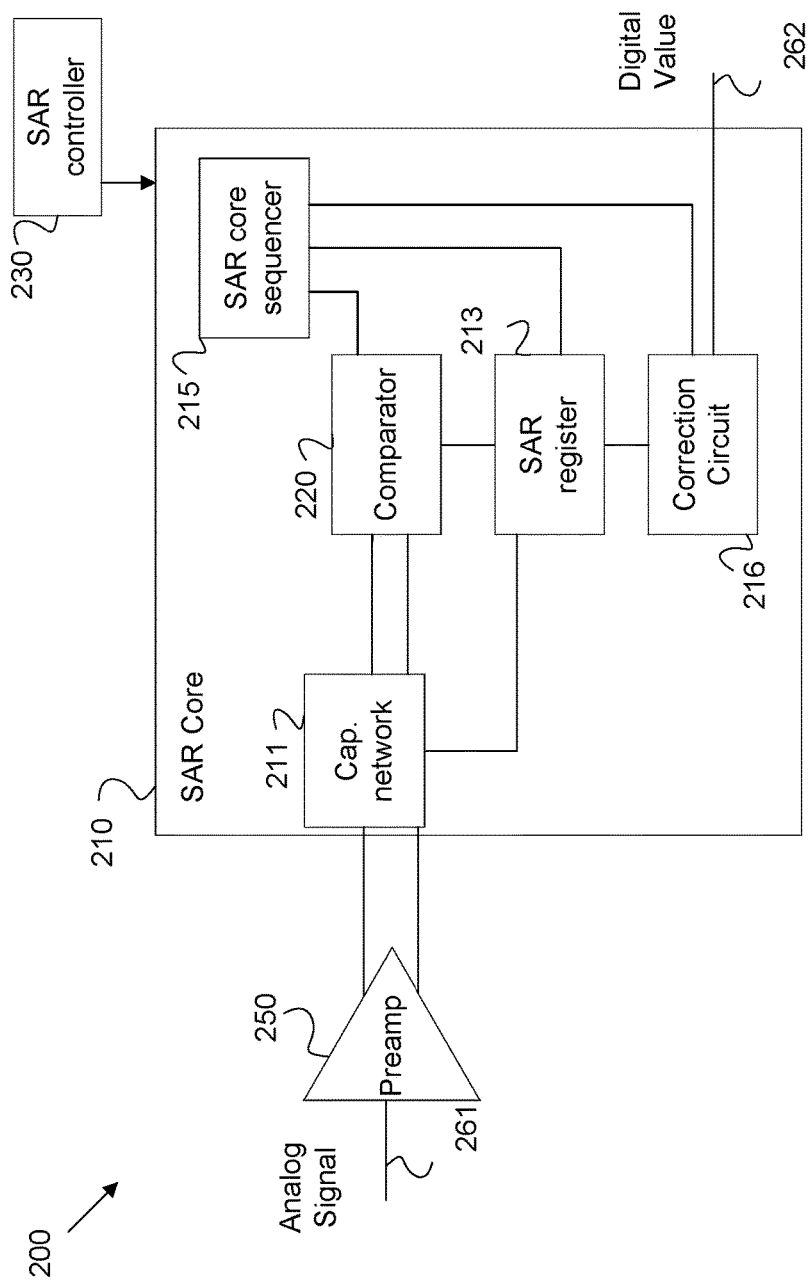
FIG. 2 is a schematic diagram of an example SAR core network.

FIG. 2 is a schematic diagram of an example SAR core network 200, which may be employed to implement a SAR ADC architecture, such as SAR ADC 100 architecture. The SAR core network 200 may comprise at least one SAR core 210, but may also employ a plurality of SAR cores 210. A group of one or more SAR cores 210 may be referred to herein as a SAR unit for clarity of discussion. The SAR core 210 receives and samples an analog signal 261 and outputs corresponding digital value(s) 262.

The SAR core network 200 includes a preamplifier 250 coupled to the SAR core 210. A preamplifier 250 is any electronic device that increases the power of a weak electrical signal to create a signal of sufficient strength for further processing. For example, the preamplifier 250 may amplify the analog signal 261 for application to a capacitive network 211 in the SAR core 210 for sampling. The capacitive network 211 may be substantially similar to a combination of capacitive network 111 and DAC 114. Hence, the capacitive network 211 may take a sample of the analog signal 261, as amplified, and store the sample for approximation as a digital value 262. As such, the capacitive network 211 may be referred to as a sample and hold circuit. The analog signal 261 may be forwarded via anti-aliasing (AA) filter(s) to mitigate signal distortion.

Once the analog signal 261 has been sampled by the capacitive network 211, the SAR core 210 may employ one or more comparators 220 to approximate digital value(s) 262 based on the analog signal 261 sample via successive comparison. For example, each SAR core 210 may employ a LSB comparator and may be coupled to a separate MSB comparator, which may be shared between multiple SAR cores 210 in some examples. In such a case, the MSB comparator makes comparisons to determine an MSB, while the LSB comparators determine the LSBs. Such a separation may mitigate processing difficulties caused by large signal swings between successive samples. The comparator(s) 220 may be substantially similar to comparator 120. For example, the comparators 220 may each contain internal preamplifiers, a programmable trim filter, and a latch, which can be activated to make a comparison between inputs. The internal preamplifiers amplify the sample and the reference value from the capacitive network 211 (e.g. from the sample capacitors and the DAC). The latch may then select and lock in a comparison of such values. The programmable trim filter may provide sufficient bandwidth to ensure preamplifiers settle at correct values before the latch activates as discussed in more detail below.

The SAR core 210 may also include a SAR register 213, which may be substantially similar to SAR 113. The SAR core 210 may operate by accepting a sample of the analog signal at the capacitive network 211, which may also include a DAC. The most significant bit of the sample is forwarded from the capacitive network 211 to the comparator(s) 220 (e.g. at a MSB comparator) and compared to a reference value from the SAR register 213 and/or the DAC in the capacitive network 211. The result is stored in the SAR register 213. Such process is then repeated for each successive LSB at the comparator(s) (e.g. at a LSB comparator 321), with the results stored in the SAR register 213 as an approximated digital value 262. The SAR core 210 may include a SAR core sequencer 215, which may be a control circuit configured to control the components of SAR core 210 in order to enact the sampling and successive approximation sequence. For example, the SAR core sequencer 215 may manage the duty cycle for the SAR core 210 by sending command pulses to the SAR core 210 components for each clock cycle according to a finite state machine. The SAR core 210 may be implemented as any form of control processor, for example as an Application Specific Integrated Circuit (ASIC), a Field Programmable Gate Array (FPGA), a Digital Signal Processor (DSP), a general purpose processor, and/or any other control circuit.

Capacitors in the capacitor network 211 may vary in capacitance due to variations in manufacturing processes. The SAR core network 200 may include a correction circuit 216 to support calibration to correct for such variations. A calibration circuit may be employed to determine of an array of capacitor weight values for capacitors in the capacitive network 211. During SAR operation, the correction circuit 216 may generate digital signal values 262 based on the approximate digital values stored in the SAR register 213 and the capacitor weight values stored in a capacitor weight Look Up Table (LUT). The correction circuit 216 may be configured from any logic circuit capable of determining capacitor weight values and determining digital values 262 based on the capacitor weight values and the results from the SAR register 213. For example, the correction circuit 216 may include an ASIC, a FPGA, a DSP, a general purpose processor, etc.

The network 200 may also include a SAR controller 230 coupled to one or more SAR cores 210. The SAR controller 230 may manage the SAR process on each core 210 by communicating with the SAR core sequencers 215. Depending on the example, the SAR controller 230 or the SAR core sequencer 215, may control/set the programmable trim filter in the comparator 220 on startup based on settings in firmware. The SAR controller 230 may include an ASIC, a FPGA, a DSP, a general purpose processor, etc.

Figure 3:
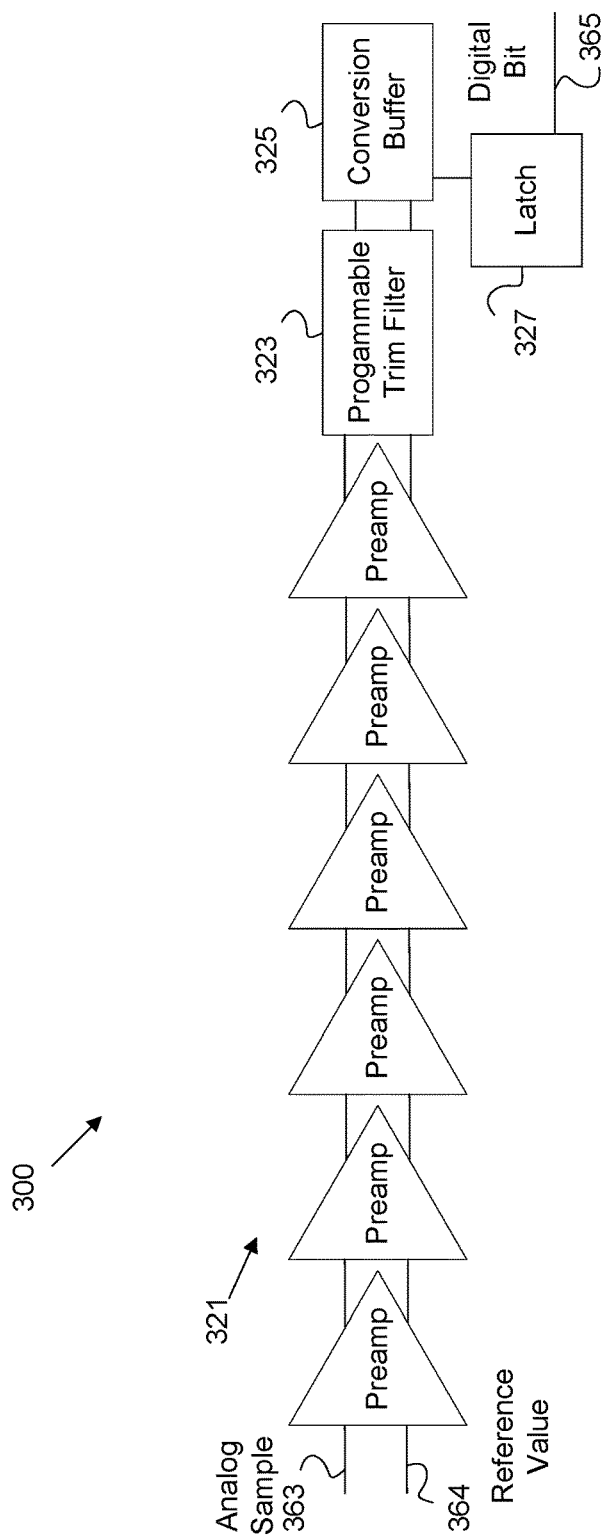
FIG. 3 is a schematic diagram of an example comparator.

FIG. 3 is a schematic diagram of an example comparator 300, which may be substantially similar to comparator 120 and/or comparator(s) 220. The comparator 300 may be configured to employ differential signals. Hence, each input may include a signal pair, with the actual value of the signal indicated by a difference between an analog sample 363 and a reference value 364. The comparator 300 may be employed in a SAR ADC, such as SAR ADC 100 and/or SAR core network 200. The comparator 300 may be coupled to a sampling network that stores samples of an analog signal as analog samples 363. The comparator 300 may also be coupled to a DAC, and may receive the reference values 364 from the DAC and/or a SAR register. The comparator 300 successively compares the analog sample 363 to reference values 364 to determine a digital value of multiple digital bits 365 corresponding to the sample 363 of the analog signal.

The comparator 300 includes a plurality of comparator preamplifiers 321. A comparator preamplifier 321 is any device in a comparator 300 designed to amplify an input signal by a pre-determined amount for further processing by other components. As shown, preamplifiers 321 are applied to amplify the analog sample 363 pair and the reference value 364 pair. Multiple preamplifier 321 stages may be employed to reduce the amount of amplification required from each individual preamplifier 321. While six preamplifier 321 stages are shown, any number of preamplifier 321 stages may be employed. Further, the preamplifiers 321 are coupled to a power rail and a drain rail. Such connections are omitted in FIG. 3 for reasons of visual clarity.

The comparator 300 also includes a programmable trim filter 323 selectively set to adjust a bandwidth of the comparator preamplifiers 321 to a bandwidth value corresponding with a preamplifier settling time subceeding a preamplifier settling threshold. Subceed, as used herein, means to be less than (e.g. the opposite of exceed). As noted above, the preamplifiers 321 may be implemented in CMOS. As such, preamplifiers 321 in different microchips may operate at different speeds due to variances in the manufacturing process. Hence, preamplifier 321 settling time may vary between microchips. Preamplifier settling time is an amount of time required to change a preamplifier 321 output from a first value to a second value at a steady state. The programmable trim filter 323 may be controllable by a processor via transistors in the filter. The programmable trim filter 323 is operable to reduce/increase load capacitance to the output of the preamplifiers 321, which in turn increases/decreases preamplifier 321 bandwidth. Increased bandwidth decreases settling time. Hence, the programmable trim filter 323 is operable to decrease preamplifier 321 settling time. Increasing bandwidth may result in increased noise and increased power usage. As such, the programmable trim filter 323 may provide just enough bandwidth to decrease settling time below a preamplifier settling threshold. As used herein, the preamplifier settling threshold is a minimum settling time that results in errors due to a latch 327 selecting a value before preamplifier settling is complete. As discussed below, a process monitor may be employed to determine the programmable trim filter 323 setting for a particular microchip that results in a bandwidth value with a preamplifier 321 settling time subceeding a preamplifier 321 settling threshold. In some examples the programmable time filter 323 may also be distributed between preamplifier 321 stages. It should be noted that an example output of a final comparator preamplifier 321 stage may include an output resistance of about 100 kiloohm (kohm) per side. Hence, very small capacitors may be employed in the programmable trim filter 323.

The comparator 300 also includes a conversion buffer 325. A conversion buffer is any circuit that converts a differential signal into a single ended signal. The single ended output of the conversion buffer 325 is then forwarded to the latch 327. The latch 327 is included in the comparator 300 to compare the analog sample 363 to the reference value 364 and store the results of the comparison of the sample 363 and the reference values 364. For example, the latch 327 may compare the analog sample 363 to the reference value 364 and output a positive one when the analog sample 363 is larger and a negative one when the reference value 364 is larger. Such values may be converted to a binary zero and one format by other components. The output of the latch 327 for a particular comparison is output from the comparator 300 as a digital bit 365, which is stored in a SAR as part of a digital value. The digital value may then be interleaved as part of a stream of digital values that correspond to the analog signal.

Figure 4:
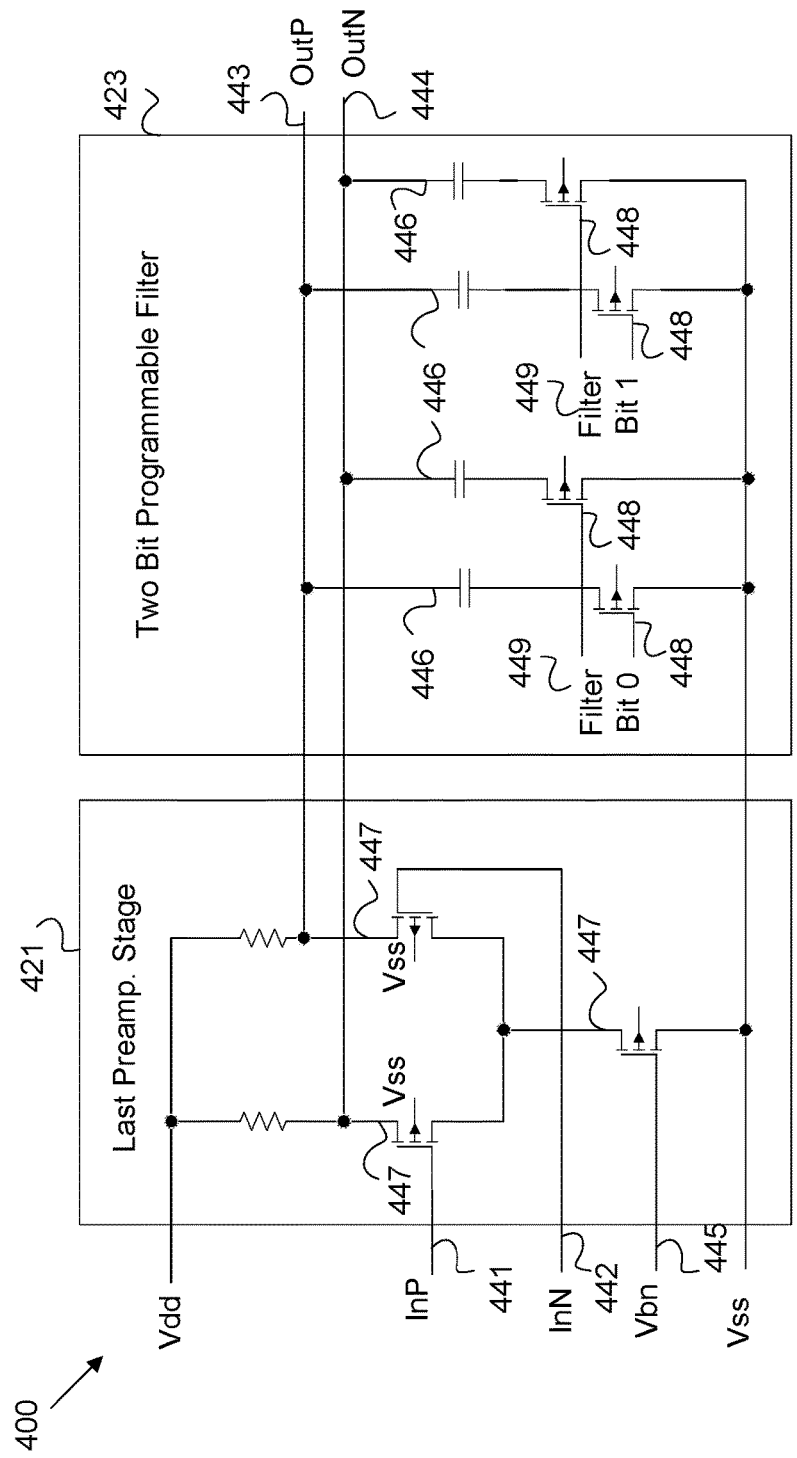
FIG. 4 is a schematic diagram of an example programmable trim filter network.

FIG. 4 is a schematic diagram of an example programmable trim filter network 400, which may be employed in a comparator 120, 220, and/or 300. For example, the programmable trim filter network 400 may operate as a programmable trim filter 323. As shown, the programmable trim filter network 400 includes a last preamplifier stage 421 and a programmable trim filter 423, which may be employed to implement a preamplifier 321 and a programmable trim filter 323, respectively. The last preamplifier stage 421 receives a negative input (InN) 442 and a positive input (InP) 441 (e.g. a differential signal. The last preamplifier stage 421 is also coupled to a voltage source (Vss), a bias voltage (Vbn) 445, and a voltage ground/drain (Vdd). The last preamplifier stage 421 also includes transistors 447. The transistors 447 are controlled by InP 441, InN 442, and Vbn 445 to adjust an amount of voltage provided by Vdd and Vss toward the programmable trim filter 423. In other words, the differential signal included in InP 441 and InN 442 creates a corresponding amplified signal from Vdd and Vss for input into the programmable trim filter 423.

The programmable trim filter 423 is depicted as a two bit filter, but additional bits may be added by adding addition pairs of capacitors 446 and transistors 448. The programmable trim filter 423 receives VSS as well as an amplified InP 441 and InN 442. InP 441 and InN 442 are forwarded along a channel and output as a positive output (OutP) 443 and a negative output (OutN) 444, respectively. Capacitors 446 are coupled to the channel for OutP 443 and OutN 444 as shown. The capacitors 446 provide a capacitive load to the differential signal. The programmable trim filter 423 also includes transistors 448 coupled to the capacitors 446 and Vss. The filter bits 449 are digital signals that control the transistors 448, which act as switches to couple the capacitors 446 to ground. This allows the filter bits 449 to control the transistors 448 to modify the load capacitance provided by the capacitors 446. As discussed above, modifying the load capacitance provided by the capacitors 446 results in modifying the bandwidth output at OutP 443 and OutN 444. As such, the filter bits 449 allow a processor to control capacitance and hence bandwidth provided to the output of the programmable trim filter network 400 by controlling transistors 448. Accordingly, a processor can reduce or increase settling time as desired by controlling transistor 448 via filter bits 449. This allows the circuit to be optimized to provide just enough bandwidth to obtain a settling time that does not produce errors, while not providing unnecessary bandwidth and hence unnecessary noise and power usage. It should also be noted that, in some examples, bandwidth may also be modified by altering transistor 447 via Vbn 445 at the last preamplifier stage 421. Accordingly, the programmable trim filter 323 can be selectively set by applying one or more filter bits 449 as input to the programmable trim filter and/or by applying a bias voltage (e.g. Vbn 445) to an amplifier 421 coupled to the programmable trim filter 423.

Figure 5:
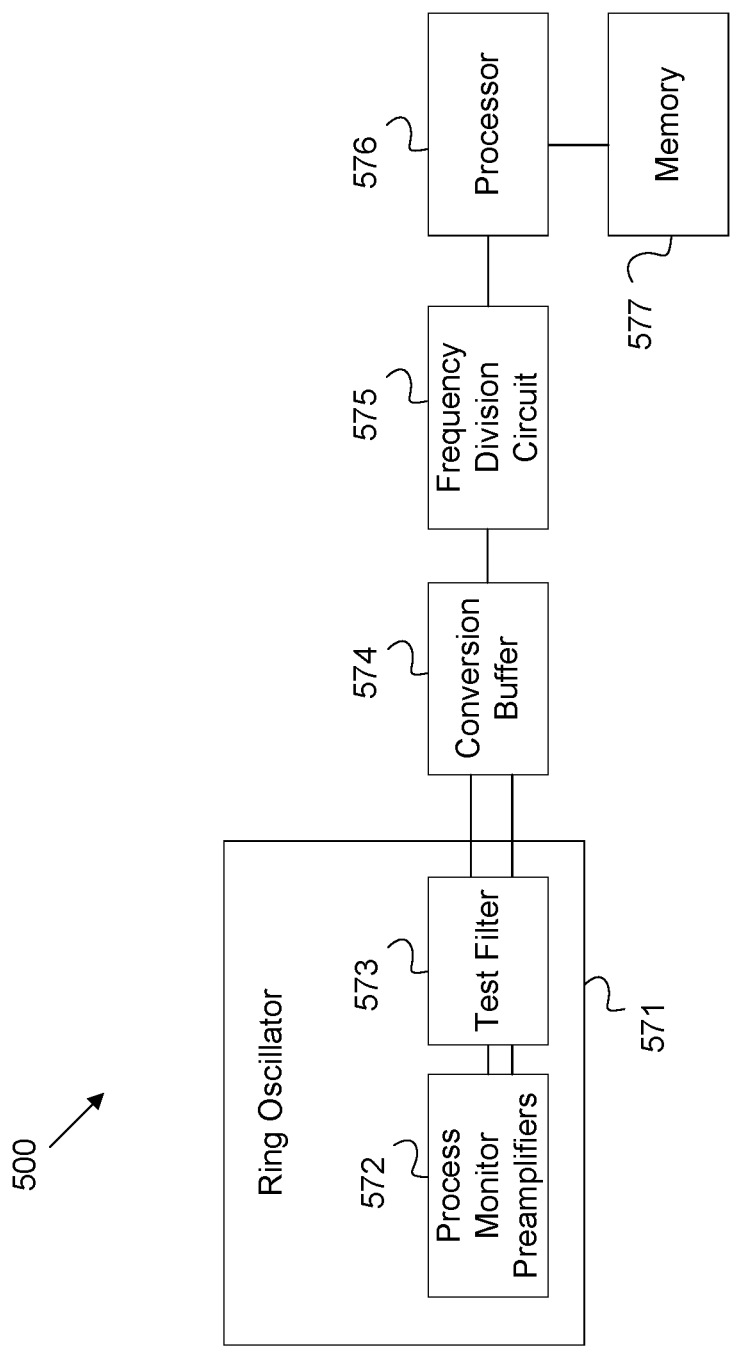
FIG. 5 is a schematic diagram of an example process monitor network.

FIG. 5 is a schematic diagram of an example process monitor 500 network. A process monitor 500 may be employed to determine the programmable trim filter setting for a particular microchip that results in a bandwidth value with a preamplifier settling time subceeding a preamplifier settling threshold. For example, a process monitor 500 may be employed in a SAR network 200, and in conjunction with a comparator 300, to determine a settling threshold for a preamplifier, such as preamplifier 321. The process monitor 500 may output data indicating a frequency response associated with the comparator preamplifiers to support selectively setting the programmable trim filter based on a determined frequency response.

The process monitor 500 includes a ring oscillator 571. A ring oscillator 571 includes a plurality of process monitor preamplifiers 572. The process monitor preamplifiers 572 may be substantially similar to a group of comparator preamplifiers, with an output of the last stage coupled back into the input of the first preamplifier stage. The process monitor preamplifiers 572 may share a common configuration with the comparator preamplifiers. This allows the process monitor 571 to test a frequency response of the process monitor preamplifiers 572 and assume a similar frequency response for the comparator preamplifiers. Such an assumption may be valid as an entire microchip may exhibit substantially the same speed behavior (e.g. slow, average, or fast). The ring oscillator 571 may also include a test filter 573 to support measurement of the frequency response of the ring oscillator 572. The test filter 573 may, or may not, be similar to a programmable trim filter. The test filter 573 may be controlled by a processor 576. Hence, the test filter 573 may allow the processor 576 to vary capacitance applied to the process monitor preamplifiers 572. As such, the test filter 573 may allow the processor 576 to test the process monitor preamplifiers 572 at different bandwidths to determine the frequency response of the process monitor preamplifiers 572. Accordingly, the process monitor 500 outputs data indicating a frequency response of the ring oscillator 571 as data indicating the frequency response of the comparator preamplifiers.

The process monitor 500 may also include a conversion buffer 574, which may be substantially similar to conversion buffer 325. The conversion buffer 574 converts the differential signal in the ring oscillator 571 into a single ended signal readable by the other components. The process monitor 500 may also include a frequency division circuit 575. The frequency division circuit 575 is a circuit designed to reduce the frequency of the process monitor 500 output to support measurement of the frequency response of the ring oscillator 571. For example, the frequency division circuit 575 may include a plurality of chained flip flops.

The process monitor 500 may also include a processor 576 and a memory 577. The processor may be any processing circuit, such as an ASIC, an FPGA, a DSP, a general purpose processor, and/or any other control circuit. The memory 577 may be any non-volatile memory device, such as Read Only Memory (ROM), Electrically Erasable Programmable Read-Only Memory (EEPROM), flash memory, etc. The processor 576 may control testing of the ring oscillator 571 by controlling the test filter 573. The processor 576 may receive the results via the conversion buffer 574, the frequency division circuit 575, and/or via an ADC. The processor 576 may then measure the frequency response associated with the comparator preamplifiers based on the process monitor 500 output data. Further, the processor 576 may selectively set the programmable trim filter based on the measured frequency response. For example, the processor 576 may determine the appropriate programmable trim filter setting by testing the ring oscillator 571 to determine a bandwidth value sufficient to cause a preamplifier settling time for the process monitor preamplifiers 572 to subceed a preamplifier settling threshold. The processor 576 may then store the results as a programmable trim filter setting in the memory 577. The memory 577 may then store the programmable trim filter setting in firmware employed by the SAR ADC.

For example, the process monitor 500 may be employed on a first startup of a microchip containing a SAR ADC as discussed herein. The process monitor 500 may determine the programmable trim filter setting as discussed herein, and store such setting for use in firmware. During subsequent operation, the ring oscillator 571 may be powered down and the processor 576 may employ the firmware to operate the ADC. Hence, the processor 576 may control the programmable trim filter in the capacitor according to the measurements made by the process monitor 500. As an example, the processor 576 may also act as a SAR core sequencer 215 and/or a SAR controller 230. The processor 576 may also perform any other method disclosed herein, such as method 900 as discussed below.

Figure 6:
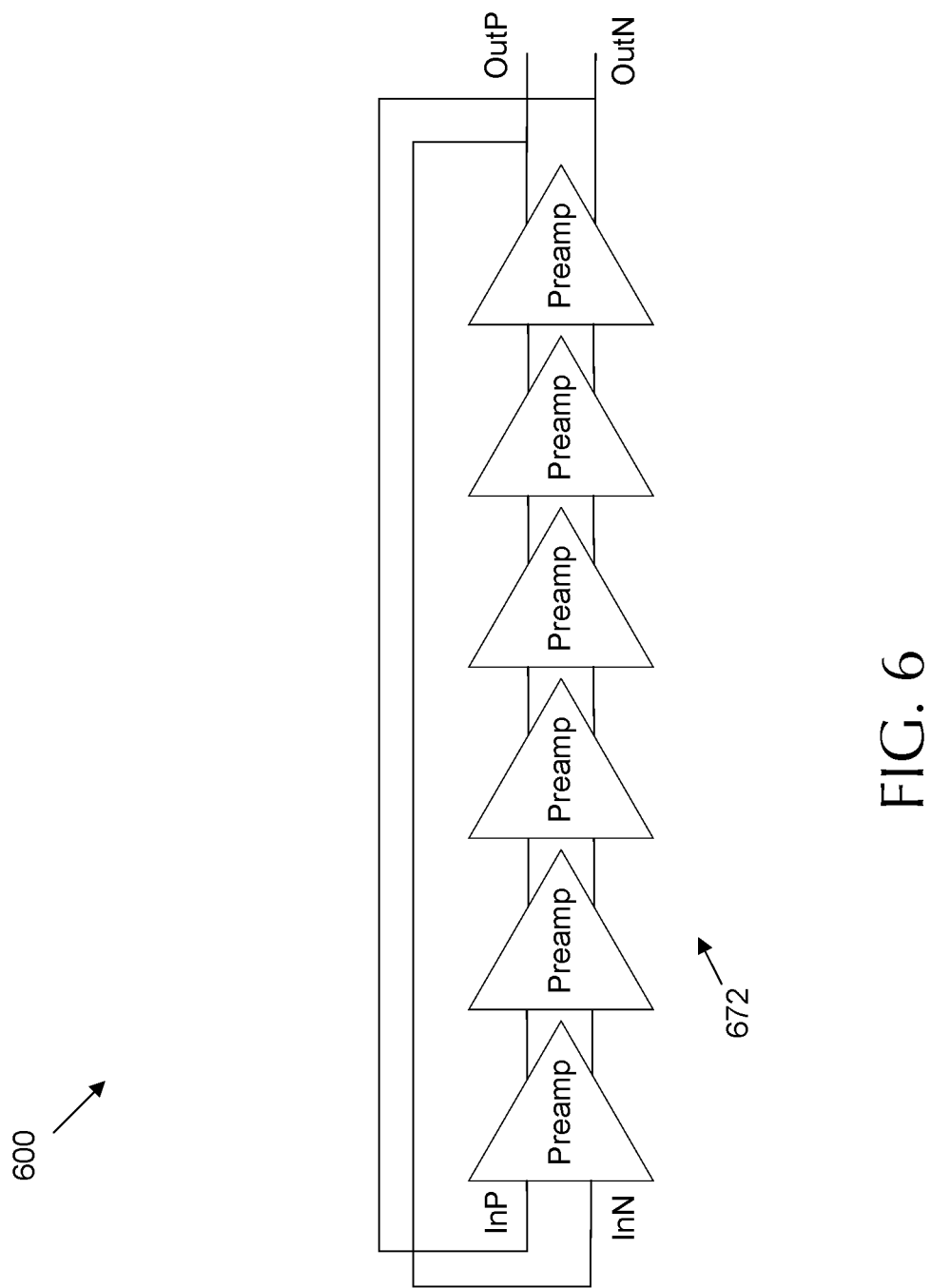
FIG. 6 is a schematic diagram of an example ring oscillator.

FIG. 6 is a schematic diagram of an example ring oscillator 600, that may be employed to implement a ring oscillator 571. The ring oscillator 600 may contain multiple process monitor preamplifiers 672 coupled as a series of stages to amplify a differential signal. The process monitor preamplifiers 672 may be substantially similar to process monitor preamplifiers 572. The process monitor preamplifiers 672 may be coupled in a substantially similar configuration to the preamplifiers 321 in the comparator. The positive output (OutP) is coupled back into the negative input (InN) and the negative output (OutN) is coupled back into the positive input (InP), respectively. This allows values in the ring oscillator to oscillate between positive and negative values, which may create a waveform. The frequency response and hence settling time of the system can be determined by testing the ring oscillator 600.

Figure 7:
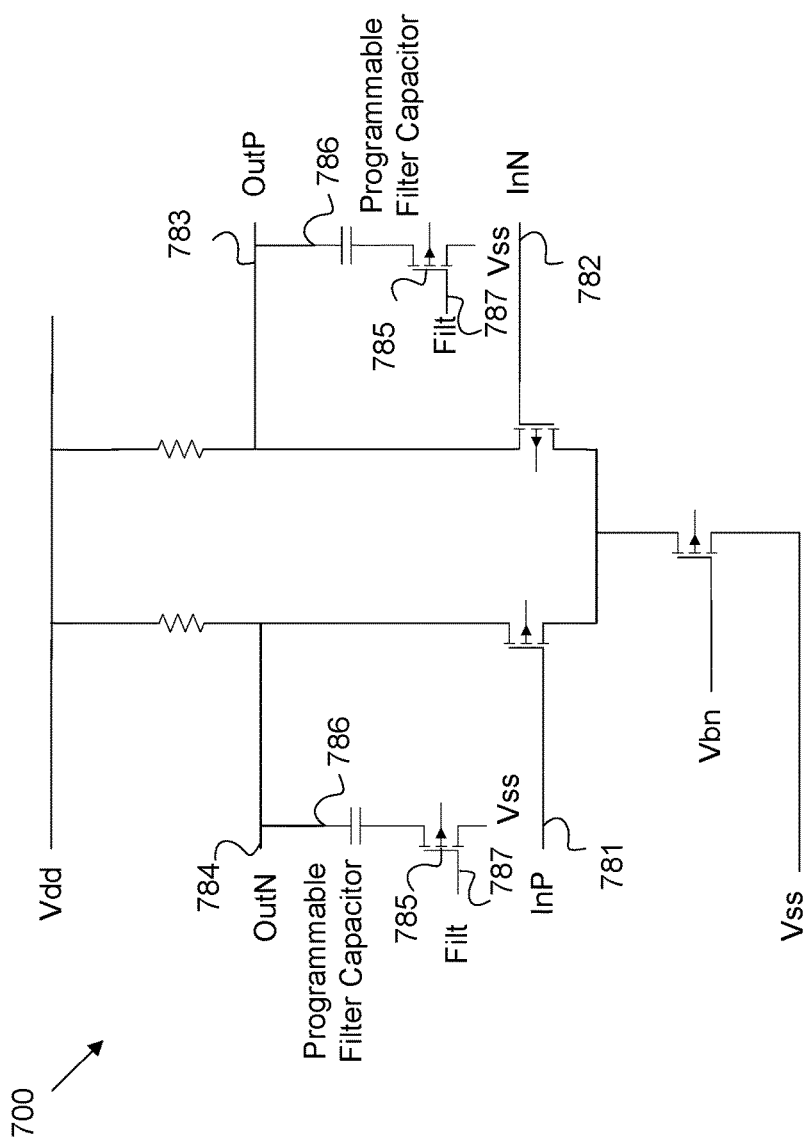
FIG. 7 is a schematic diagram of an example test filter.

FIG. 7 is a schematic diagram of an example test filter 700, that may be employed to implement a test filter 573. In some examples, the test filter 700 may also be employed to implement a programmable trim filter 323. The test filter 700 may be coupled to the output of a ring oscillator, such as ring oscillator 571 and/or 600 via InP 781 and InN 782. The test filter 700 may forward such signals through a network of capacitors, transistors, and resistors toward an OutP 783 and an OutN 784. The test filter 700 includes programmable filter capacitors 786 controlled by transistors 785 via a filter input (Filt) 787. A processor may control Filt 787 to control transistors 785. The transistors 785 act as switches to switch the capacitors 786 to ground and therefore adjust the load capacitance provided to OutN 784 and OutP 783. In this example, a single filter bit is employed for Filt 787. As such, the test filter 700 can be controlled to reduce a variable amount of capacitance, and consequently bandwidth, to a ring oscillator. A processor may employ the test filter 700 to test an output of a ring oscillator under different conditions and determine an overall speed/frequency response of the microchip.

Figure 8:
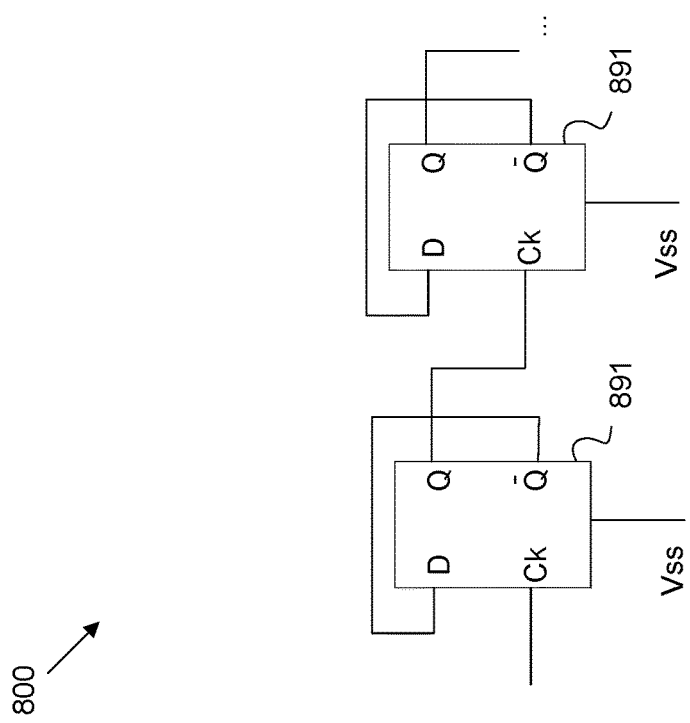
FIG. 8 is a schematic diagram of an example frequency division circuit.

FIG. 8 is a schematic diagram of an example frequency division circuit 800, which may be employed to implement a frequency division circuit 575. The frequency division circuit 800 may include a plurality of flip flops 891 coupled in series. The flip flops 891 are powered by Vss. A first flip flop 891 is coupled an output of a conversion buffer, and hence receives an output of a ring oscillator and a test filter as converted from a differential signal to a single ended signal. The output of the conversion buffer is received at a clock (Ck) input of the first flip flop 891. The flip flop 891 employs both an input (D), an output (Q), and an inverted Q. When rising/falling edge is received from the ring oscillator, the first flip flop 891 changes state and outputs a new value from Q and inverted Q. The inverted Q value is fed back into input D and the Q value is output to the second flip flop 891. This causes a change in value on a rising/falling edge to change from the first flip flop 891. Hence the first flip flop 891 changes value every other rising/falling edge of the ring oscillator, the second flip flop 891 changes value every other rising/falling edge of the first flip flop 891 (e.g. every fourth rising/falling edge of the ring oscillator), a third flip flop 891 changes value every other rising/falling edge of the second flip flop 891 (e.g. every eighth rising/falling edge of the ring oscillator), etc. Any number of flip flops 891 may be employed to divide the frequency of the output of the ring oscillator as desired to obtain a frequency for measurement by a processor and/or related components.

Figure 9:
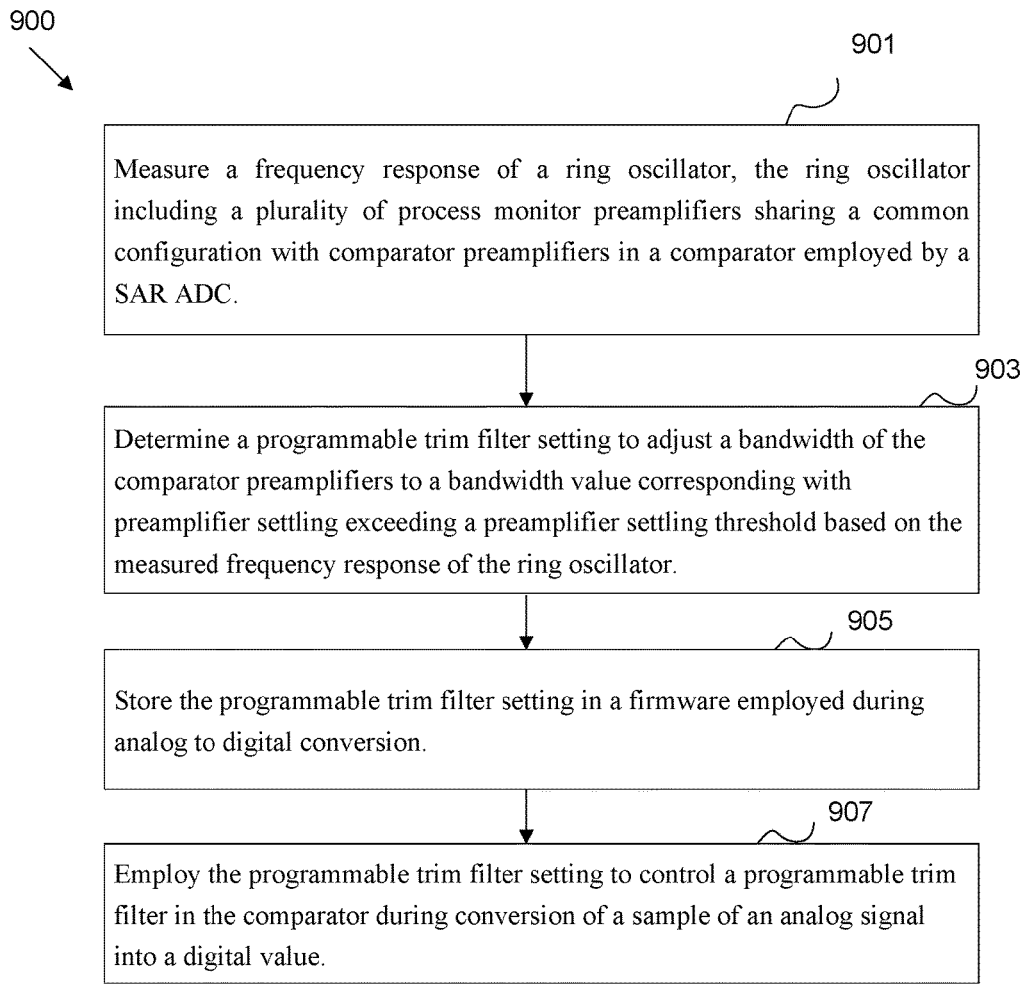
FIG. 9 is a flowchart of an example method of programming a SAR ADC trim filter.

FIG. 9 is a flowchart of an example method 900 of programming a SAR ADC trim filter, such as programmable trim filter 323 and/or 423. Method 900 may be implemented on a processor, such as processor 576. For example, method 900 may operate on a SAR core network 200 to configure a comparator 300 based on a process monitor 500. Method 900 may also be implemented based on instructions stored in a non-transitory medium, and hence act as a computer program product.

At block 901, a frequency response of a ring oscillator is measured. As noted above, the ring oscillator may include a plurality of process monitor preamplifiers sharing a common configuration with comparator preamplifiers. The comparator preamplifiers may be included in a comparator employed by a SAR ADC. Measuring the frequency response of the ring oscillator may include receiving output from a process monitor. The process monitor may include the ring oscillator. Further, the output may be received via a frequency division circuit to reduce a frequency of the process monitor output. Also, the frequency response of the ring oscillator may be measured by employing a test filter to selectively vary capacitance (and bandwidth) applied to the output of the process monitor preamplifiers.

At block 903, a programmable trim filter setting is determined. The programmable trim filter setting may be employed to adjust a bandwidth of the comparator preamplifiers. For example, the bandwidth of the comparator amplifiers may be set to a bandwidth value corresponding with preamplifier settling time subceeding a preamplifier settling threshold. The programmable trim filter setting may be determined/selected based on the frequency response of the ring oscillator as measured in block 901.

At block 905, the programmable trim filter setting determined in block 903 may be stored in a non-volatile memory. For example, the programmable trim filter setting may be stored in a memory location associated with a firmware employed during analog to digital conversion.

At block 907, the programmable trim filter setting may be employed to control a programmable trim filter during SAR. For example, the programmable trim filter may be included in the comparator, and may modify the bandwidth employed by the comparator during conversion of a sample of an analog signal into a digital value. Hence, the trim filter setting may control the settling time of the comparator preamplifiers as well as the noise of the SAR ADC. As such, the trim filter setting may be employed to optimize the comparator for bandwidth, settling time, and noise based on the measured speed of the microchip. As noted above, the programmable trim filter may include a network of capacitors coupled to the comparator preamplifiers and operated via controllable transistors. Further, the comparator may include a latch to store a comparison of a sample and a reference value. The programmable trim filter may be coupled between the comparator preamplifiers and the latch.

Figure 10:
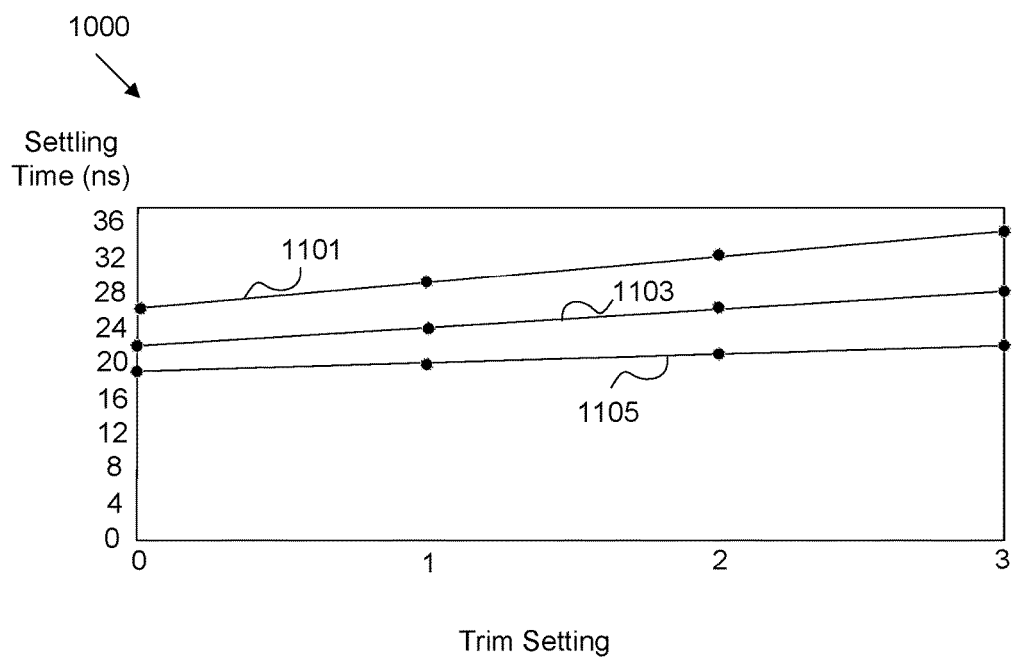
FIG. 10 is a graph depicting example settling performances of SAR ADCs with programmable trim filters.

FIG. 10 is a graph 1000 depicting example settling performances of SAR ADCs with programmable trim filters, such as programmable trim filter 323 and/or 423. Groups of SAR ADCs, in a manufactured batch, settle to a latched value at different speeds due to manufacturing variance. Graph 1000 includes a slow group 1101, an average group 1103, and a fast group 1105 of SAR ADCs. The settling times of each group are shown as in terms of a programmable trim setting on the horizontal axis versus a settling time in nanoseconds (ns) on the vertical axis. Higher trim settings indicate lower applied capacitance and higher bandwidth. As an example, a slow group 1101 settles approximately nine ns faster on a highest bandwidth/trim setting than the lowest bandwidth/trim setting. Meanwhile, the average group 1103 and the fast group 1105 gain six and three ns, respectively, between the highest bandwidth setting and the lowest bandwidth setting. Accordingly, each group can be set to different bandwidth/trim settings as desired by employing the programmable trim filter. Specifically, each group can employ a minimum trim setting that provides sufficient settling time to avoid errors without adding unneeded bandwidth and hence unneeded additional noise and power consumption.

Examples of the disclosure may operate on a particularly created hardware, on firmware, digital signal processors, or on a specially programmed general purpose computer including a processor operating according to programmed instructions. The terms "controller" or "processor" as used herein are intended to include microprocessors, microcomputers, Application Specific Integrated Circuits (ASICs), and dedicated hardware controllers. One or more aspects of the disclosure may be embodied in computer-usable data and computer-executable instructions (e.g. computer program products), such as in one or more program modules, executed by one or more processors (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as Random Access Memory (RAM), Read Only Memory (ROM), cache, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer readable media excludes signals per se and transitory forms of signal transmission. In addition, the functionality may be embodied in whole or in part in firmware or hardware equivalents such as integrated circuits, field programmable gate arrays (FPGA), and the like. Particular data structures may be used to more effectively implement one or more aspects of the disclosure, and such data structures are contemplated within the scope of computer executable instructions and computer-usable data described herein.

Aspects of the present disclosure operate with various modifications and in alternative forms. Specific aspects have been shown by way of example in the drawings and are described in detail herein below. However, it should be noted that the examples disclosed herein are presented for the purposes of clarity of discussion and are not intended to limit the scope of the general concepts disclosed to the specific examples described herein unless expressly limited. As such, the present disclosure is intended to cover all modifications, equivalents, and alternatives of the described aspects in light of the attached drawings and claims.

References in the specification to embodiment, aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described in connection with a particular aspect, such feature, structure, or characteristic can be employed in connection with another disclosed aspect whether or not such feature is explicitly described in conjunction with such other disclosed aspect.

Examples

Illustrative examples of the technologies disclosed herein are provided below. An embodiment of the technologies may include any one or more, and any combination of, the examples described below.

Example 1 includes a successive approximation register (SAR) analog to digital converter (ADC) comprising: a sampling network to store a sample of an analog signal; and a comparator to successively compare the sample to reference values to determine a digital value corresponding to the sample of the analog signal, the comparator including: a plurality of comparator preamplifiers, and a programmable trim filter selectively set to adjust a bandwidth of the comparator preamplifiers to a bandwidth value corresponding with preamplifier settling time subceeding a preamplifier settling threshold.

Example 2 includes the SAR ADC of Example 1, further comprising a process monitor to output data indicating a frequency response associated with the comparator preamplifiers to support selectively setting the programmable trim filter based on the determined frequency response.

Example 3 includes the SAR ADC of Example 2, wherein the process monitor includes a ring oscillator of process monitor preamplifiers sharing a common configuration with the comparator preamplifiers, and wherein the process monitor outputs data indicating a frequency response of the ring oscillator as the data indicating the frequency response of the comparator preamplifiers.

Example 4 includes the SAR ADC of Examples 2-3, wherein the ring oscillator includes a test filter to support measurement of the frequency response of the ring oscillator.

Example 5 includes the SAR ADC of Examples 2-4, wherein the process monitor further includes a frequency division circuit to reduce a frequency of process monitor output to support measurement of the frequency response of the ring oscillator.

Example 6 includes the SAR ADC of Examples 2-5, further comprising a processor to: measure the frequency response associated with the comparator preamplifiers based on the process monitor output data, and selectively set the programmable trim filter based on the measured frequency response.

Example 7 includes the SAR ADC of Examples 1-6, further comprising a memory to store a programmable trim filter setting in a firmware employed by the SAR ADC.

Example 8 includes the SAR ADC of Examples 1-7, wherein the programmable trim filter includes a network of capacitors coupled to the comparator preamplifiers and operated via controllable transistors.

Example 9 includes the SAR ADC of Examples 1-8, wherein the programmable trim filter operates on a differential signal.

Example 10 includes the SAR ADC of Examples 1-9, wherein the comparator includes a latch to store a comparison of the sample and the reference values, the programmable trim filter coupled between the comparator preamplifiers and the latch.

Example 11 includes a method comprising: measuring a frequency response of a ring oscillator, the ring oscillator including a plurality of process monitor preamplifiers sharing a common configuration with comparator preamplifiers in a comparator employed by a successive approximation register (SAR) analog to digital converter (ADC); and determining a programmable trim filter setting to adjust a bandwidth of the comparator preamplifiers to a bandwidth value corresponding with preamplifier settling time subceeding a preamplifier settling threshold based on the measured frequency response of the ring oscillator.

Example 12 includes the method of Example 11, further comprising storing the programmable trim filter setting in a firmware employed during analog to digital conversion.

Example 13 includes the method of Examples 11-12, wherein the programmable trim filter setting is employed to control a programmable trim filter in the comparator during conversion of a sample of an analog signal into a digital value, the programmable trim filter including a network of capacitors coupled to the comparator preamplifiers and operated via controllable transistors.

Example 14 includes the method of Example 13, wherein the comparator includes a latch to store a comparison of the sample and a reference value, the programmable trim filter coupled between the comparator preamplifiers and the latch.

Example 15 includes the method of Examples 11-14, wherein measuring the frequency response of the ring oscillator includes receiving output from a process monitor including the ring oscillator, the output received via a frequency division circuit to reduce a frequency of the process monitor output.

Example 16 includes a successive approximation register (SAR) analog to digital converter (ADC) comprising: a comparator including a plurality of comparator preamplifiers and a programmable trim filter; a process monitor including a ring oscillator of process monitor preamplifiers sharing a common configuration with the comparator preamplifiers; and a processor to: measure a frequency response of the ring oscillator, and determine a programmable trim filter setting for the programmable trim filter to adjust a bandwidth of the comparator preamplifiers to a bandwidth value corresponding with preamplifier settling time subceeding a preamplifier settling threshold based on the measured frequency response of the ring oscillator.

Example 17 includes the SAR ADC of Example 16, further comprising memory to store the programmable trim filter setting in a firmware employed during analog to digital conversion.

Example 18 includes the SAR ADC of Examples 16-17, wherein the processor is further to employ the programmable trim filter setting to control the programmable trim filter in the comparator during conversion of a sample of an analog signal into a digital value.

Example 19 includes the SAR ADC of Examples 16-18, wherein the programmable trim filter includes a network of capacitors coupled to the comparator preamplifiers and operated by the processor via controllable transistors.

Example 20 includes the SAR ADC of Examples 16-19, wherein the comparator further includes a latch to store a comparison of a sample of an analog signal and a reference value, the programmable trim filter coupled between the comparator preamplifiers and the latch.

Example 21 includes the SAR ADC of Examples 1-9, 16-20 and/or the method of Examples 11-15, wherein the programmable trim filter is selectively set by applying a filter bit input to the programmable trim filter.

Example 22 includes the SAR ADC of Examples 1-9, 16-20 and/or the method of Examples 11-15, wherein the programmable trim filter is selectively set by applying a bias voltage an amplifier coupled to the programmable trim filter.

The previously described examples of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the disclosure have been illustrated and described for purposes of illustration, it will be understood that various modifications may be made without departing from the spirit and scope of the disclosure. Accordingly, the disclosure should not be limited except as by the appended claims.

We claim:

1. A successive approximation register (SAR) analog to digital converter (ADC) comprising:
    a sampling network to store a sample of an analog signal;
    a comparator to successively compare the sample to reference values to determine a digital value corresponding to the sample of the analog signal, the comparator including:
        a plurality of comparator preamplifiers, and
        a programmable trim filter selectively set to adjust a bandwidth of the comparator preamplifiers to a bandwidth value corresponding with preamplifier settling time subceeding a preamplifier settling threshold;
    a process monitor to output data indicating a frequency response associated with the comparator preamplifiers to support selectively setting the programmable trim filter based on the determined frequency response, wherein the process monitor includes a ring oscillator of process monitor preamplifiers sharing a common configuration with the comparator preamplifiers, and wherein the process monitor outputs data indicating a frequency response of the ring oscillator as the data indicating the frequency response of the comparator preamplifiers.

2. The SAR ADC of claim 1, wherein the ring oscillator includes a test filter to support measurement of the frequency response of the ring oscillator.

3. The SAR ADC of claim 1, wherein the process monitor further includes a frequency division circuit to reduce a frequency of process monitor output to support measurement of the frequency response of the ring oscillator.

4. The SAR ADC of claim 1, further comprising a processor to:
    measure the frequency response associated with the comparator preamplifiers based on the process monitor output data, and
    selectively set the programmable trim filter based on the measured frequency response.

5. The SAR ADC of claim 1, further comprising a memory to store a programmable trim filter setting in a firmware employed by the SAR ADC.

6. The SAR ADC of claim 1, wherein the programmable trim filter includes a network of capacitors coupled to the comparator preamplifiers and operated via controllable transistors.

7. The SAR ADC of claim 1, wherein the programmable trim filter operates on a differential signal.

8. The SAR ADC of claim 1, wherein the comparator includes a latch to store a comparison of the sample and the reference values, the programmable trim filter coupled between the comparator preamplifiers and the latch.

9. A method comprising:
    measuring a frequency response of a ring oscillator, the ring oscillator including a plurality of process monitor preamplifiers sharing a common configuration with comparator preamplifiers in a comparator employed by a successive approximation register (SAR) analog to digital converter (ADC);
    determining a programmable trim filter setting to adjust a bandwidth of the comparator preamplifiers to a bandwidth value corresponding with preamplifier settling time subceeding a preamplifier settling threshold based on the measured frequency response of the ring oscillator; and adjusting the bandwidth of the comparator preamplifiers based on the determined programmable trim filter setting.

10. The method of claim 9, further comprising storing the programmable trim filter setting in a firmware employed during analog to digital conversion.

11. The method of claim 9, wherein the programmable trim filter setting is employed to control a programmable trim filter in the comparator during conversion of a sample of an analog signal into a digital value, the programmable trim filter including a network of capacitors coupled to the comparator preamplifiers and operated via controllable transistors.

12. The method of claim 11, wherein the comparator includes a latch to store a comparison of the sample and a reference value, the programmable trim filter coupled between the comparator preamplifiers and the latch.

13. The method of claim 9, wherein measuring the frequency response of the ring oscillator includes receiving output from a process monitor including the ring oscillator, the output received via a frequency division circuit to reduce a frequency of the process monitor output.

14. A successive approximation register (SAR) analog to digital converter (ADC) comprising:

a comparator including a plurality of comparator preamplifiers and a programmable trim filter;

a process monitor including a ring oscillator of process monitor preamplifiers sharing a common configuration with the comparator preamplifiers; and a processor to:
measure a frequency response of the ring oscillator, and
determine a programmable trim filter setting for the programmable trim filter to adjust a bandwidth of the comparator preamplifiers to a bandwidth value corresponding with preamplifier settling time subceeding a preamplifier settling threshold based on the measured frequency response of the ring oscillator.

15. The SAR ADC of claim 14, further comprising memory to store the programmable trim filter setting in a firmware employed during analog to digital conversion.

16. The SAR ADC of claim 14, wherein the processor is further to employ the programmable trim filter setting to control the programmable trim filter in the comparator during conversion of a sample of an analog signal into a digital value.

17. The SAR ADC of claim 14, wherein the programmable trim filter includes a network of capacitors coupled to the comparator preamplifiers and operated by the processor via controllable transistors.

18. The SAR ADC of claim 14, wherein the comparator further includes a latch to store a comparison of a sample of an analog signal and a reference value, the programmable trim filter coupled between the comparator preamplifiers and the latch.

* * * * *